United States Patent
Seppinen et al.

(10) Patent No.: US 6,833,769 B2
(45) Date of Patent: Dec. 21, 2004

(54) VOLTAGE CONTROLLED CAPACITIVE ELEMENTS HAVING A BIASING NETWORK

(75) Inventors: Pauli Seppinen, Espoo (FI); Juha Hallivuori, Tampere (FI); Aarno Pärssinen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/394,463

(22) Filed: Mar. 21, 2003

(65) Prior Publication Data

US 2004/0183610 A1 Sep. 23, 2004

(51) Int. Cl.⁷ .................................................. H03B 1/04
(52) U.S. Cl. .............. 331/177 V; 331/179; 331/117 FE
(58) Field of Search ............................. 331/177 V, 179, 331/117 R, 117 FE; 455/552

(56) References Cited

U.S. PATENT DOCUMENTS

| 5,357,222 A | 10/1994 | Hietala ........................ 332/124 |
| 5,471,652 A | 11/1995 | Hulkko ........................ 455/76 |
| 5,650,754 A | * 7/1997 | Joshi et al. ................ 331/36 C |
| 5,764,109 A | 6/1998 | Kukkonen .................... 331/44 |
| 5,926,071 A | 7/1999 | Kukkonen ................... 331/109 |
| 6,061,575 A | * 5/2000 | Lombardi ................ 455/552.1 |
| 6,091,309 A | * 7/2000 | Burke et al. ............ 331/117 R |
| 2001/0020875 A1 | 9/2001 | Jansson |
| 2001/0050598 A1 | * 12/2001 | Mourant et al. ... 331/117 OOR |
| 2002/0014925 A1 | * 2/2002 | Ochiai ................ 331/117 OFE |

FOREIGN PATENT DOCUMENTS

EP          0 599 505 A1     1/1994

* cited by examiner

*Primary Examiner*—Benny Lee
*Assistant Examiner*—Joseph Chang
(74) *Attorney, Agent, or Firm*—Harrington & Smith, LLP

(57) ABSTRACT

A voltage-controlled oscillator includes a resonator circuit and a voltage source. The resonator circuit includes a capacitive circuit that has a plurality of analog voltage controlled capacitive elements coupled to one another. The voltage source is coupled to the resonator circuit and provides a voltage to the plurality of analog voltage controlled capacitive elements. Each of the plurality of analog voltage controlled capacitive elements is activated as a function of the voltage thereby increasing linearity of a frequency tuning voltage parameter of the resonator.

24 Claims, 9 Drawing Sheets

| FIG.2A |
|--------|
| FIG.2B |

VOLTAGE CONTROLLED CAPACITIVE ELEMENTS HAVING A BIASING NETWORK

FIELD OF THE INVENTION

This invention relates generally to a voltage controlled oscillator (VCO) and more particularly to a voltage controlled oscillator having a plurality of MOS capacitors. The VCO has substantially linear tuning characteristics and an increased tuning range.

BACKGROUND OF THE INVENTION

A local oscillator (LO) signal is required for receiving and transmitting in a wireless radio frequency (RF) communication device, such as a cellular telephone. A voltage controlled oscillator (VCO) is typically used in a phase-locked loop (PLL) to generate the LO signal. An example of the use of a VCO in a mobile station can be found in commonly assigned U.S. Pat. No. 5,471,652, entitled "Frequency Synthesizer and Multiplier Circuit Arrangement for a Radio Telephone", by Jaakko Hulkko. The circuit arrangement disclosed therein is used for a radio telephone wherein a universal application is provided by phase locked circuits and a multiplier circuit is controlled by a processor of a mobile phone.

Another example of a VCO used in a mobile station can be found in commonly assigned U.S. Pat. No. 5,926,071, entitled "Minimization of the Power Consumption in an Oscillator", by Osmo Kukkonen. The oscillator's output signal is detected as a DC voltage in a clamp/voltage multiplier circuit. The detected signal is supplied in a feedback loop to a field effect transistor (FET) controlling the oscillator's current, whereby the FET controls the current in the main current path to a predetermined minimum value.

U.S. Pat. No. 5,764,109, entitled "Voltage-Controlled Oscillator (VCO) Having a Voltage Derived from its Output to Tune its Center Frequency", by Osmo Kukkonen relates to an electrically tunable voltage controlled oscillatory circuit, wherein the negative bias voltage (–Vcf) of a capacitance diode needed for tuning the center frequency of the oscillatory circuit is generated on the basis of an electric oscillating signal produced by the oscillatory circuit itself. The oscillating signal is used for generating a negative voltage with a clamp/voltage multiplier circuit and it is adjusted to a desired value with an adjustment circuit in which the values of the components can be permanently adjusted. Alternatively, the adjustment circuit may include an active component that can have an effect on the value of the negative bias voltage (–Vcf) during the use of the oscillatory circuit.

European Patent Application 0,599,505, entitled, "Tunable Resonance Circuit for a Voltage Controlled Oscillator", by Jorma Liukkonen relates to a voltage-controlled oscillator (VCO) of a frequency synthesizer that can be controlled to expand the frequency range by a switch. Depending on the anode voltage of a diode, two voltage control ranges can be produced for the voltage controlled oscillator (VCO). This means that the VCO has two frequency ranges although the external voltage changes only in one range.

Reference may also be had to commonly assigned U.S. Pat. No.: 5,357,222, "Voltage Controlled Component Including a Capacitive Diode Biased to Operate in the Linear Region", by Seppo Hietala.

In oscillator applications, it is desirable to have a large tuning range and favorable noise performance. The gain of the VCO may be difficult to keep constant since it is dependent on the varactor tuning linearity. It is also desirable to have a substantially direct and linear relationship between the input voltage (control voltage) and the output frequency of the oscillator.

The linearity of the frequency tuning characteristics is typically achieved by using additional integrated circuit (IC) process steps to manipulate the capacitance characteristics of a device. Also, the effect of a non-constant VCO gain can be compensated by a feedback loop to the current of the charge pump. The tuning range can be increased dramatically by using two or more separate VCOs.

The power consumption of third generation and multi-mode phones is likely to increase compared to conventional mobile communications systems. Thus the operation and stand-by times of these phones will also likely increase. The need for power consumption and integrated circuit (IC) area reduction is evident.

One concern is that it is very difficult to simultaneously achieve a large tuning range and good phase noise performance. Additionally, the gain of the VCO is difficult to keep constant.

What is needed to advance the state of the art is a voltage controlled oscillator that has improved linearity of the tuning characteristics and an enhanced tuning range with reduced phase noise.

SUMMARY OF THE PREFERRED EMBODIMENTS

The foregoing and other problems are overcome, and other advantages are realized, in accordance with the presently preferred embodiments of these teachings.

Accordingly, one embodiment of the present invention is directed a voltage-controlled oscillator that includes a resonator circuit and a voltage source. The resonator circuit includes a capacitive circuit. The capacitive circuit includes a plurality of analog voltage controlled capacitive elements coupled to one another. The voltage source is coupled to the resonator circuit and provides a voltage to the plurality of analog voltage controlled capacitive elements. Each of the plurality of analog voltage controlled capacitive elements is activated as a function of the voltage thereby increasing linearity of a frequency tuning voltage parameter of the resonator.

Another embodiment of the present invention is directed to a variable capacitor. The variable capacitor includes an input node and an output node, a plurality of analog voltage controlled capacitive elements and a control voltage. The plurality of analog voltage controlled capacitive elements are electronically coupled to one another. The control voltage input is coupled to a control voltage source and coupled in common to each of the plurality of analog voltage controlled capacitive elements. The control voltage input provides a control voltage to each of the analog voltage controlled capacitive elements, such that each of the plurality of analog voltage controlled capacitive elements is activated as a function of the control voltage to provide a substantially linear change in capacitance over a range of control voltages between the input node and the output node.

Yet another embodiment of the present invention is directed to a variable capacitor device that includes a first capacitive circuit, a diode circuit and a control voltage input. The control voltage input provides a control voltage to the first capacitive circuit and the diode circuit, such that the first capacitive circuit and the diode circuit are activated in a sequence that is a function of the control voltage.

Furthermore, the variable capacitor may include a bias voltage input that is coupled to the first capacitive circuit and the diode circuit. The bias voltage input provides a bias voltage to the first capacitive circuit and the diode circuit such that the first capacitive circuit and the diode circuit are activated as a function of the bias voltage. This biasing of the capacitive circuit and the diode circuit may optionally activate the first capacitive circuit such that the first capacitive circuit affects a tuning curve of the diode circuit where the derivative of the capacitance is not constant.

Yet another embodiment of the present invention is directed to a method of operating a voltage controlled oscillator that includes generating a control voltage and providing a capacitive circuit that includes a plurality of analog voltage controlled capacitive elements, coupled in parallel. Each of the plurality of analog voltage controlled capacitive elements is sequentially activated as a function of the control voltage to increase the linearity of a frequency tuning voltage parameter.

This invention also provides a mobile station that includes a frequency synthesizer comprised of a PLL that includes a VCO. The frequency output of the VCO is tuned with a resonator that comprises a variable capacitance. The variable capacitance is constructed from a plurality of voltage controlled capacitive elements coupled in parallel. Also provided is an activating means for sequentially activating individual ones of the plurality of voltage controlled capacitive elements as a function of an input analog control voltage and a bias network. The result is an increase in the linearity of a frequency tuning curve of the VCO. The analog control voltage is sourced by a PLL phase detector. The bias network comprises a resistive network coupled to the voltage controlled capacitive elements, where the resistive network is coupled to one of a fixed or a variable bias voltage. The bias voltage may be established by one of an operational mode or frequency selection logic of the mobile station. At least one fixed capacitive element can be provided that is switchably coupled with at least one voltage controlled capacitive element to provide a plurality of discrete frequency tuning ranges.

BRIEF DESCRIPTION OF THE DRAWINGS

The foregoing and other aspects of these teachings are made more evident in the following Detailed Description of the Preferred Embodiments, when read in conjunction with the attached Figures.

DETAILED DESCRIPTION OF THE PREFERRED EMBODIMENTS

The present invention pertains to the field of wireless telecommunications/mobile phones and more precisely to the voltage controlled oscillator (VCO) design. The present invention further relates to the multimode VCO design of the mobile station or base station and its power consumption and cost reduction. The present invention linearizes the tuning characteristics of both MOS and PN-junction based varactors at the same time enabling a larger tuning range with good phase noise. The present invention enables the use of large capacitance tuning range of a MOS transistor with linear frequency tuning characteristics.

The present invention reduces the power consumption in a mobile phone including radio frequency (RF), baseband (BB), software (SW) and user interface (UI) considerations. The present invention provides power and cost saving in a low-power system solution.

The present invention enables the use of large capacitance tuning range of a MOS transistor with a linear frequency tuning characteristics. Previously, the tuning characteristic had been dependent only on the MOS/diode varactor capacitance characteristics. Now, only one VCO is needed and the IC area can be reduced, for example, by a factor of two in GSM/WCDMA applications.

The present invention utilizes a voltage biasing for the MOS varactors. Typically this can be generated in any suitable manner and does not significantly increase the complexity of the design.

In multimode terminals, the frequency tuning range requirement is increased. One straightforward method is to use at least two voltage controlled oscillators (VCOs) to cover the required bandwidth. In order to reduce the IC area consumed by the integrated VCOs, the frequency tuning range, achieved with one VCO, should to be maximized. One possible approach is to use the large tuning range achieved with the metal oxide semiconductor (MOS) varactor. The present invention may also be used with a diode varactor. In the embodiment using a diode varactor, the tuning range is also extended. Additionally, when utilizing terminal products most of the ICs are implemented with submicron CMOS processes where the supply voltage is small and high VCO gain is needed. The present invention enhances the ability to use the MOS transistor as a frequency tuning element. Additionally, the present invention is not restricted to a resonator used with an oscillator, but may be used with all possible resonators. In addition, all of these varactor types can be utilized in parallel with a digitally controlled capacitor.

Figure 1:
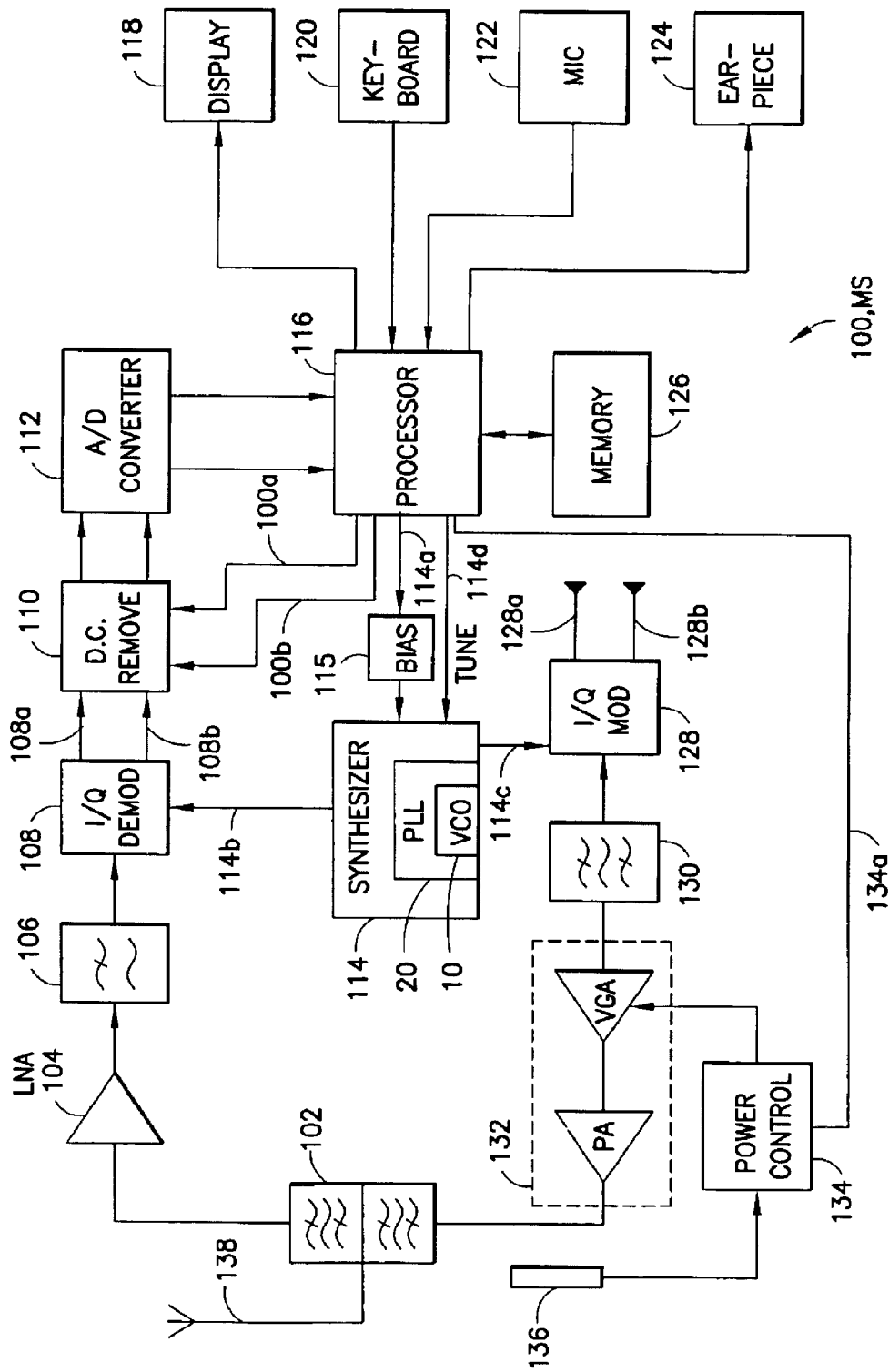
FIG. 1 is a block diagram of a mobile station that is constructed and operated in accordance with these teachings.

Reference is made now to FIG. 1, which shows a VCO 10 and a phase locked loop (PLL) 20 in the context of a wireless communication terminal transceiver, such as a cellular telephone, also referred to herein for simplicity as a mobile station 100. The VCO 10 is assumed to include an oscillator circuit and is further assumed to be integrated within an integrated circuit.

In general, a PLL, such as the PLL 20 of FIG. 1, is an electronic circuit with a voltage-driven or a current-driven oscillator that is constantly adjusted to match the phase of, and thus lock on to, the frequency of an input signal. In addition to stabilizing a particular communications channel (keeping it set to a particular frequency), a PLL can be used to generate a signal, modulate or demodulate a signal, reconstitute a signal with less noise, or multiply or divide a frequency. PLLs are frequently used in wireless communication systems, particularly where signals are carried using frequency modulation (FM) or phase modulation (PM). PLLs can also be used in systems that employ amplitude modulation (AM). Phase-locked loop devices are more commonly manufactured as integrated circuits (ICs), although discrete circuits are typically used for microwave applications.

Figure 10:
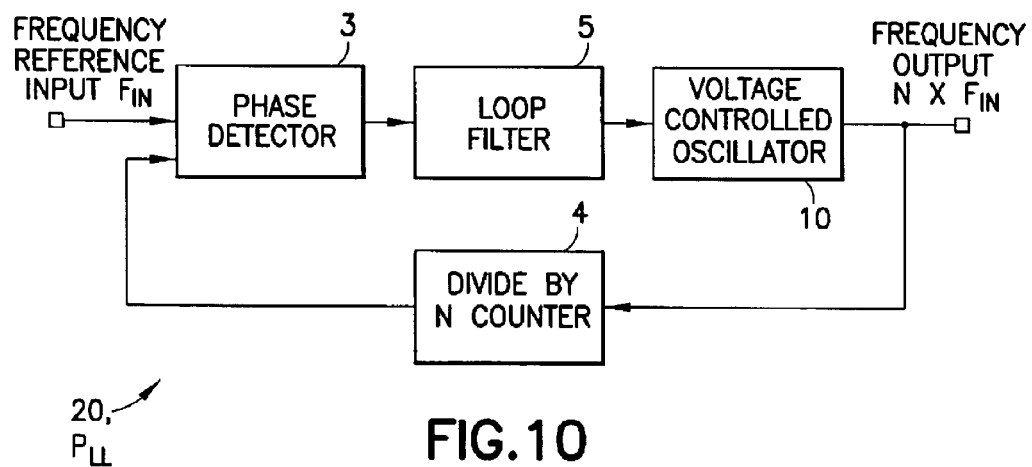
FIG. 10 is a simplified diagram of a PLL, and is useful for placing this invention into a technological context.

Referring briefly to FIG. 10, the PLL 20 includes the VCO 10 that is typically tuned using a semiconductor diode known as a varactor. The VCO 10 is initially tuned to a frequency close to the desired receiving or transmitting frequency. A circuit referred to as a phase comparator or as a phase detector 3 causes the VCO 10 to seek and lock onto the desired frequency, based on the output of a crystal-controlled reference oscillator (frequency reference input) and the VCO frequency. This procedure relies on a feedback scheme, wherein a feedback control system controls the phase of the VCO 10. In a common approach the frequency reference signal is applied to one input of the phase detector 3, and the other input of the phase detector 3 is connected to the output of a divide-by-N counter 4. Normally the frequencies of both input signals will be approximately equal, as the VCO 10 runs at N times the frequency of the reference frequency. The output of the phase detector 3 is a voltage proportional to the phase difference between the two inputs. This signal is applied to a loop filter 5. It is the loop filter that determines the dynamic characteristics of the PLL 20, as the filtered signal controls the VCO 10 (which operates at a frequency that is N times the input frequency reference). If the frequency of the VCO 10 departs from the selected crystal reference frequency, the phase detector 3 produces an error voltage that is applied to the varactor of the VCO 10, bringing the VCO 10 back to the reference frequency. The PLL 20, containing the VCO 10, comprises the frequency synthesizer 114, and wireless equipment that uses this type of frequency control is said to be "frequency-synthesized".

More specifically, FIG. 1 is a block diagram of a transmitter-receiver (transceiver) of the mobile station 100, wherein the receiver is embodied, by example only, as a direct conversion receiver. An RF signal received by an antenna 138 is conducted via a duplex filter 102 to a low noise amplifier (LNA) 104. The purpose of the duplex filter 102 is to permit the use of the same antenna both in transmitting and in receiving. Instead of the duplex filter 102, a synchronous antenna changeover switch could be used in a time-division system. An RF signal output from the LNA 104 is low-pass filtered 106 and demodulated in an I/Q demodulator 108 into an in-phase (I) signal 108a and into a quadrature (Q) signal 108b. A local oscillator signal 114b, used for I/Q demodulation, is received from a synthesizer 114. The synthesizer 114 contains the PLL 20 and the VCO 10, described in further detail below in regard to FIG. 2. In block 110, the removal of a DC voltage component is carried out, as is automatic gain control (AGC). Block 10 is controlled by a processing block 116 that may contain, for example, a microprocessor. Automatic gain control is regulated by a signal 100a and removal of the offset voltage is regulated by a signal 100b. The analog signals output from block 110 are converted into digital signals in block 112, and from which the digital signals are transferred to digital signal processing circuits in the processing block 116.

The transmitter portion of the mobile station 100 includes an I/Q modulator 128 that forms a carrier frequency signal from an in-phase (I) signal 128a and from a quadrature (Q) signal 128b. The I/Q modulator 128 receives a local oscillator signal 114c from the synthesizer 114. The generated carrier frequency signal is low-pass filtered and/or high-pass filtered by a filter 130 and is amplified by an RF amplifier 132 containing a variable gain amplifier (VGA) and a power amplifier (PA). The amplified RF signal is transferred via the duplex filter 102 to the antenna 138. A transmitter power control unit 134 controls the amplification of the RF amplifier 132 on the basis of the measured output power 136 and in accordance with a control signal 134a received from the processor 116.

The processor 116 also controls the synthesizer 114 using a programming line or bus 114a, and a bias generator 115, whereby the output frequency of the synthesizer 114 is controllably changed, as when tuning to different transmission and reception channels and/or to different frequency bands. A signal line 114d enables the processor 116 to control channel tuning, where the channel frequency is controlled by the frequency divider 4 in the PLL 20 (which affects Vt 231, 331, 431, shown in FIGS. 4, 5 and 6). Tuning via the bias generator 115 affects signals 262, 382 and 439 of FIGS. 4, 5 and 6, and represents coarse tuning to select a linear tuning region. The processor 116 can include a digital signal processor DSP 116A, shown in FIG. 2 and described in further detail below.

For completeness FIG. 1 also shows, connected to the processor 116, a memory unit 126 and a user interface having a display 118, a keyboard 120, a microphone 122 and an earpiece 124.

Figures 2, 2A:
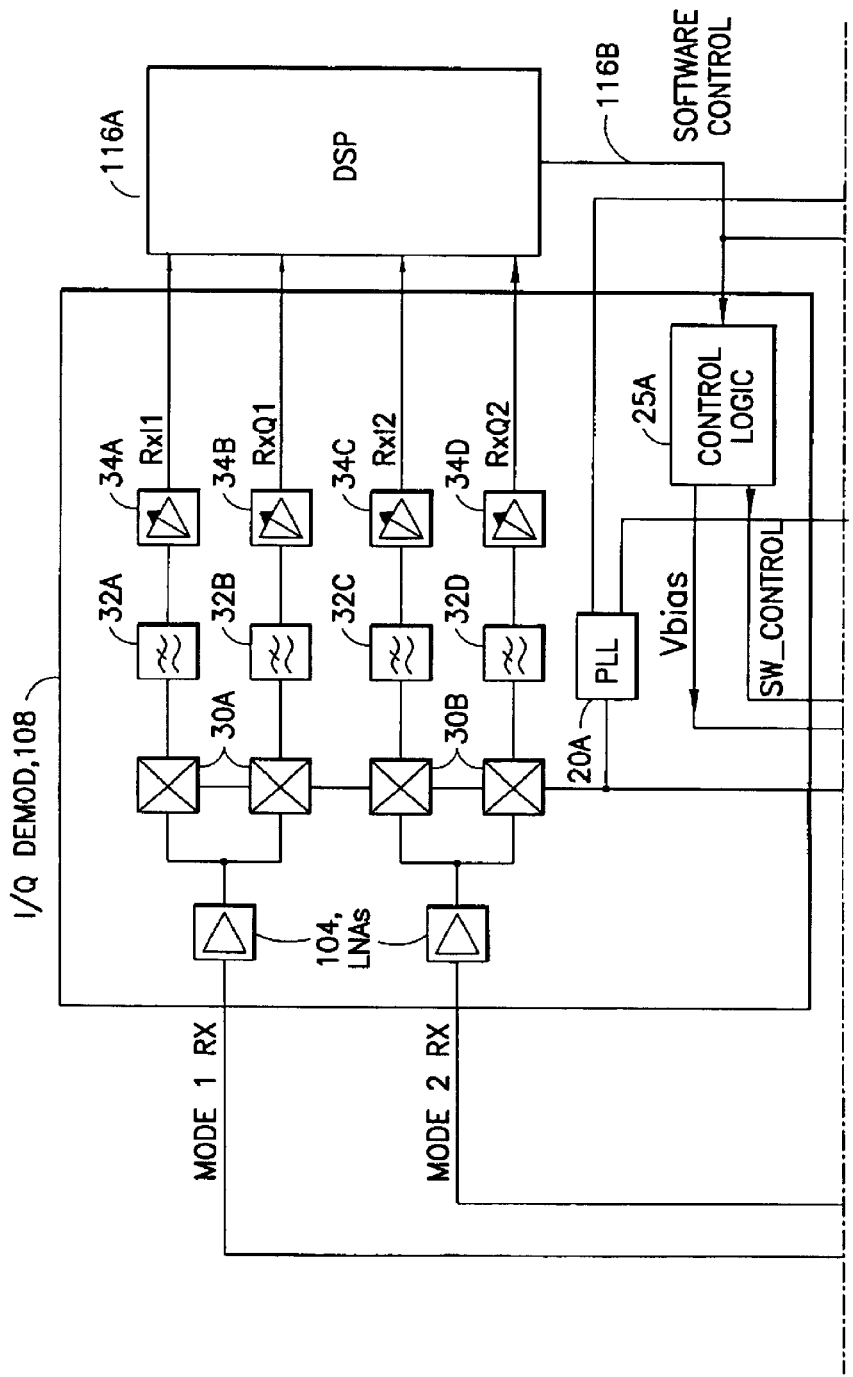
FIGS. 2A and 2B, collectively referred to as FIG. 2, are block diagrams that show a portion of the mobile station of FIG. 1 in greater detail, in particular the use of transmit (TX) and receive (RX) VCOs that are operated and controlled in accordance with these teachings.
Figure 2B:
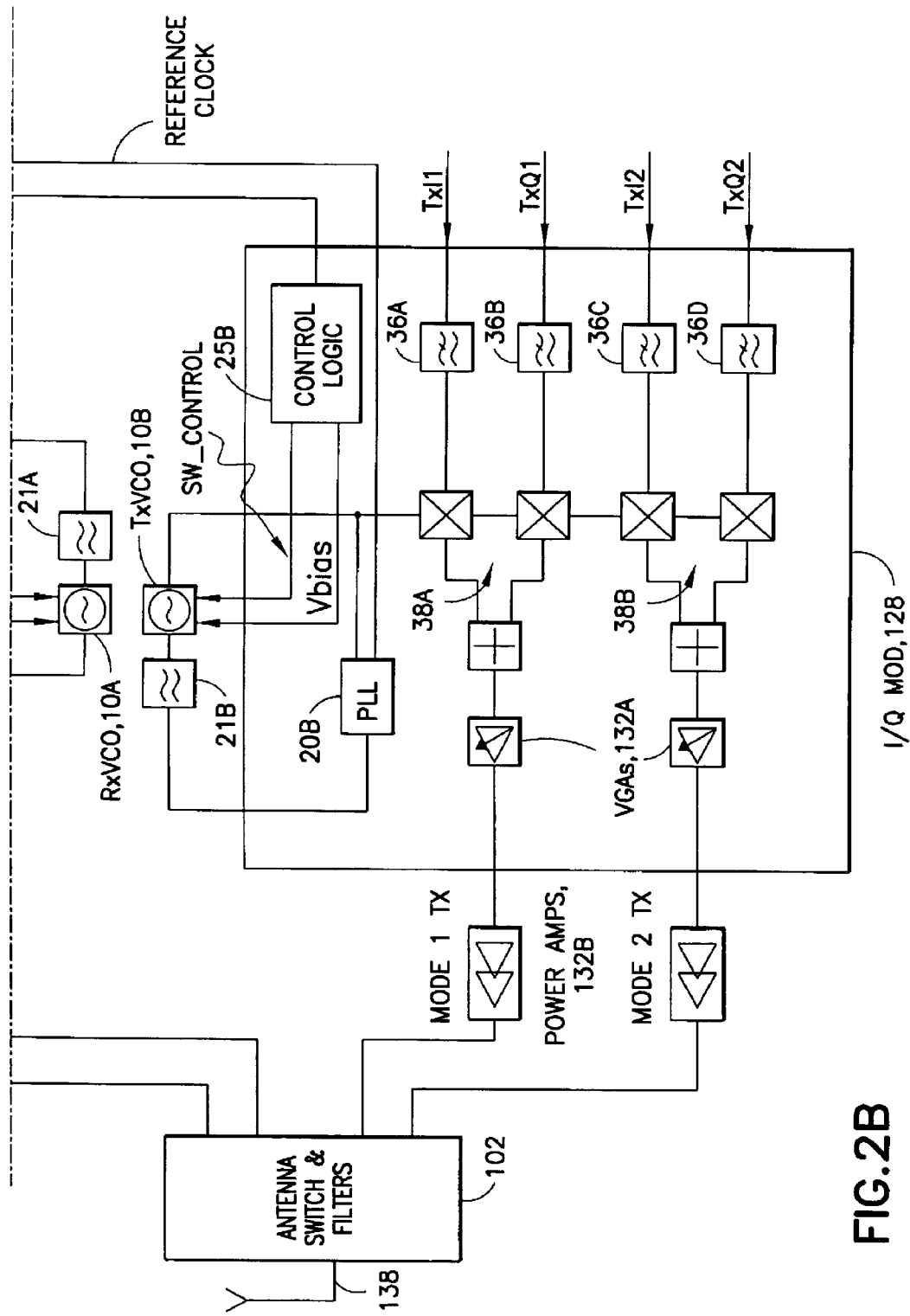

FIGS. 2A and 2B, collectively referred to as FIG. 2, show in greater detail the construction of the I/Q demodulator 108 and the I/Q modulator 128, as well as the synthesizer 114 and the DSP 116A for a dual mode (Mode 1, Mode 2) embodiment. As an example, Mode 1 is a TDMA GSM mode, while Mode 2 is WCDMA mode. Shown in the receive (RX) path in this exemplary embodiment are separate LNAs 104, a plurality of I/Q mixers 30A, 30B and associated filters 32A–32D, and variable gain amplifiers 34A–34D outputting, at any given time, either the received Mode 1 I/Q signals (RXI1, RXQ1) or the Mode 2 I/Q signals (RXI2, RXQ2) to the DSP 116A. The receive PLL 20A and associated RX_VCO 10A function as a local oscillator (LO) and provide the mixing frequency to the I/Q mixers 30A, 30B. The DSP 116A outputs over a control bus 116B control information to receive control logic 25A, which in turn can output a bias voltage (Vbias) signal and the SW_Control signal to the RX_VCO 10A. Note that the SW_Control signal can be employed for controlling the oscillator negative resistance (−R) part 158 (shown in FIG. 3), such by controlling operational characteristics of transistors in the −R part 158.

The transmit (TX) side is constructed so as to basically mirror the RX side, and includes a plurality of input filters 36A–36D for the incoming TXI1, TXQ1 and TXI2, TXQ2 signals to be transmitted. Mode 1 and 2 I/Q modulators 38A and 38B, respectively, receive their respective mixing frequencies from the PLL 20B/TX_VCO 10B, and provide their outputs to variable gain amplifiers (VGAs) 132A and power amplifiers 132B, shown collectively in FIG. 1 in circuit block 132. As in the receive side, the DSP 116A controls the magnitudes of the TX_VCO 10B Vbias voltage, and the state of the SW_Control signal, using TX control logic block 25B.

For completeness each of the RX and TX PLLs 20A and 20B is shown to contain a loop filter 21A, 21B, respectively, and receive a (common) reference clock.

Figure 3:
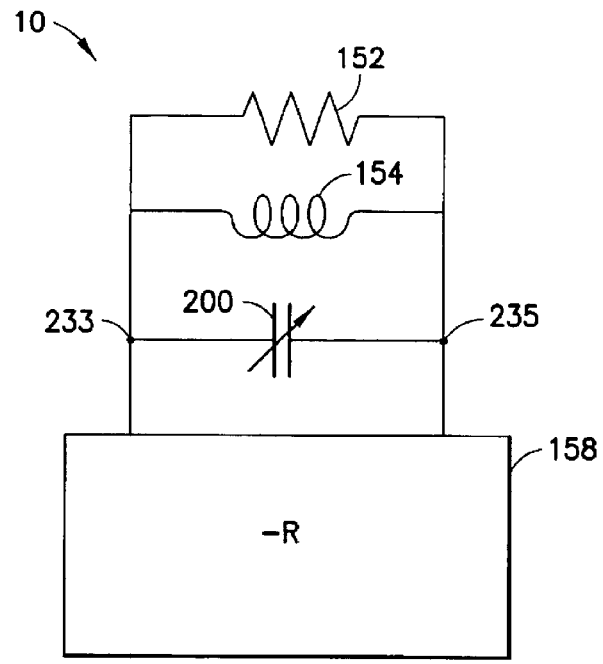
FIG. 3 shows the structure of a voltage controlled oscillator with a capacitive circuit.

FIG. 3 shows a basic structure of an oscillator 10. It is constructed from the negative resistance part 158 and from a resonator, shown as resistor 152, inductor 154 and a variable capacitance, shown as a capacitive circuit 200. Capacitive circuit 200 in accordance with the embodiments of this invention is shown in more detail in FIGS. 4, 5 and 6. Nodes 233 and 235 are also shown in FIG. 3. Often, the capacitor is used to tune the frequency since tunable inductors usually a low quality factor (Q value). The linearity requirement of this frequency tuning curve is usually required by the phase locked loop (PLL) design. It is desirable to have a linear frequency tuning, i.e. constant VCO gain. An aspect of this invention is that it is possible to provide a linear frequency tuning curve by using several MOS capacitors in capacitive circuit 200.

Figure 4:
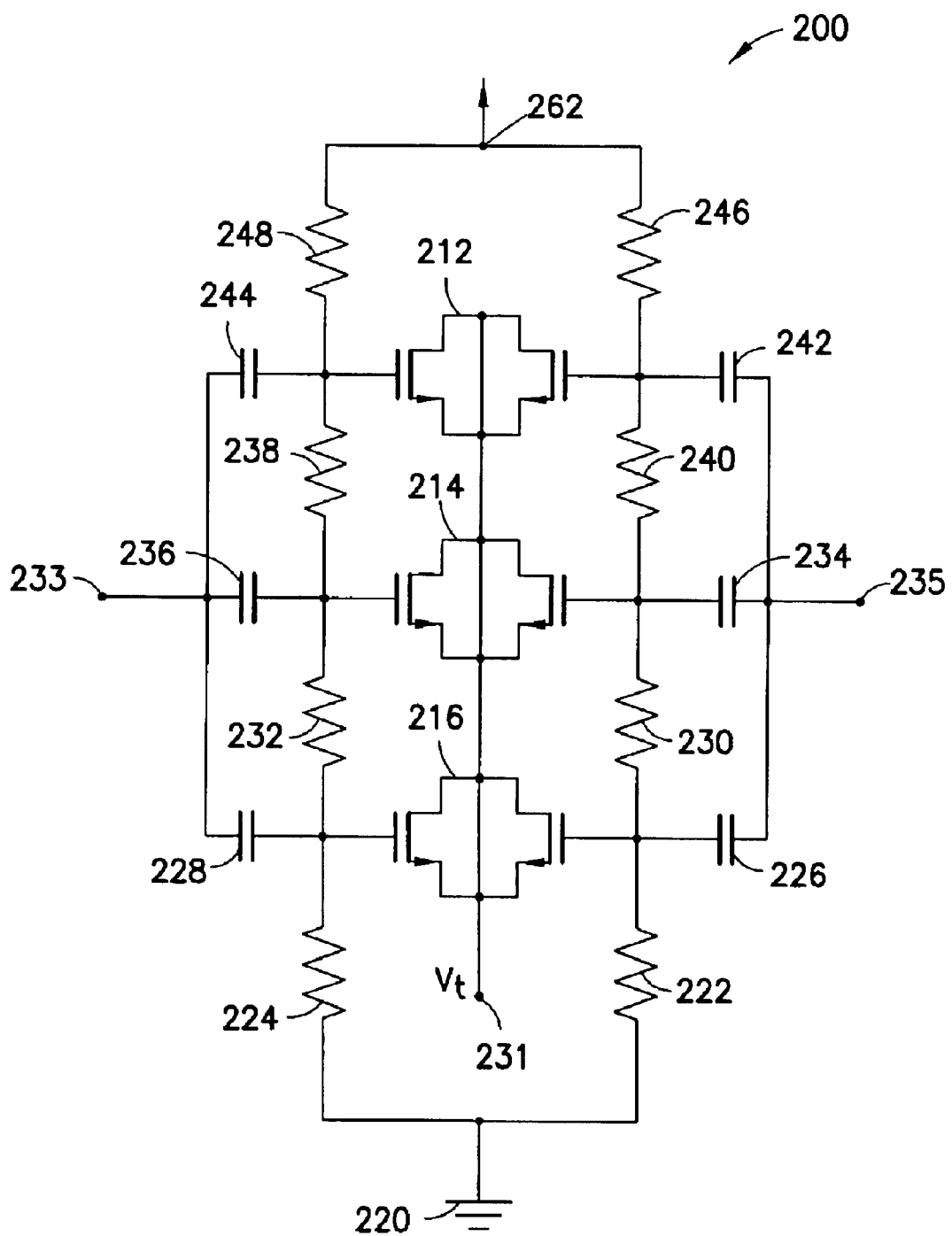
FIG. 4 shows one embodiment of a linearized MOS varactor circuit.

FIG. 4 shows an embodiment of the capacitive circuit 200 as a varactor circuit, which may be mounted on an integrated circuit (IC). Varactors are semi-conductor diodes with the properties of a voltage dependent capacitor. The capacitance is controlled by the method of doping in the depletion layer.

When operating in large-signal mode (large oscillation swing) the actual capacitance is a combination of all the capacitances, which linearizes the transitions between different varactors. FIG. 4 shows one configuration that has this behavior. In this embodiment a linearized (metal oxide semiconductor) MOS varactor is shown. The MOS varactor shown in FIG. 4 has capacitive elements 212, 214 and 216 connected in parallel. Capacitive elements 212, 214 and 216 may also be connected in series. Although three capacitive elements are shown in FIG. 4, any suitable number that comports with the design of the desired circuit may be used. Capacitive elements 212, 214, 216 may be, for example, MOS elements, analog voltage controlled elements, diodes, transistors such as MOS FETS, or PN-junction based varactors.

The MOS capacitive elements 212, 214 and 216 receive, as input, a control voltage or tuning voltage Vt 231 from a control voltage source, not shown in FIG. 4, such as a charge pump of the PLL 20 of FIG. 1. The charge pump may be the output stage of the above-mentioned phase detector 3 of FIG. 10. The control voltage is typically the control voltage from the PLL phase detector. The use of the MOS capacitive elements 212, 214 and 216 beneficially widens the tuning range and the tuning curve is linearized. These features increase the ability to control the frequency with a control voltage. Each of the capacitive elements 212, 214 and 216 is connected in parallel and biased so that the substantially linear region of each is used with selected bias voltage. Control voltage Vt determines activation of the capacitive elements 212, 214, 216 of circuit 200. The plural capacitive elements are connected in parallel such that variation in Vt determines which capacitive element is in parallel with the network. Thus, the capacitance is changed as a function of the control voltage. As shown in graphical form in FIG. 7, as Vt increases, different ones on the capacitive elements are activated via the biasing network of resistors resulting in the linearization of the combined total effective capacitance.

The varactor 200 includes resistors 222, 224, 230, 232, 238, 240, 246 and 248 and capacitors 226, 228, 234, 236, 242 and 244. Ground 220 is also shown. Note that the resistors 222, 224, 230, 232, 238, 240, 246 and 248 are provided for bias purposes, and may be replaced with a suitable source(s) of bias voltage.

Connection to Vbias 262 is used as second voltage to control the capacitive elements of FIG. 4. Vbias 262 is connected to a bias voltage supply and may be programmable. The use of two programmable voltages Vbias and Vt, increases the ability to control the capacitive elements of the circuit. Alternatively, Vbias may be set to Vcc and not variable. Alternatively, Vt may be held constant and not variable.

Figure 5:
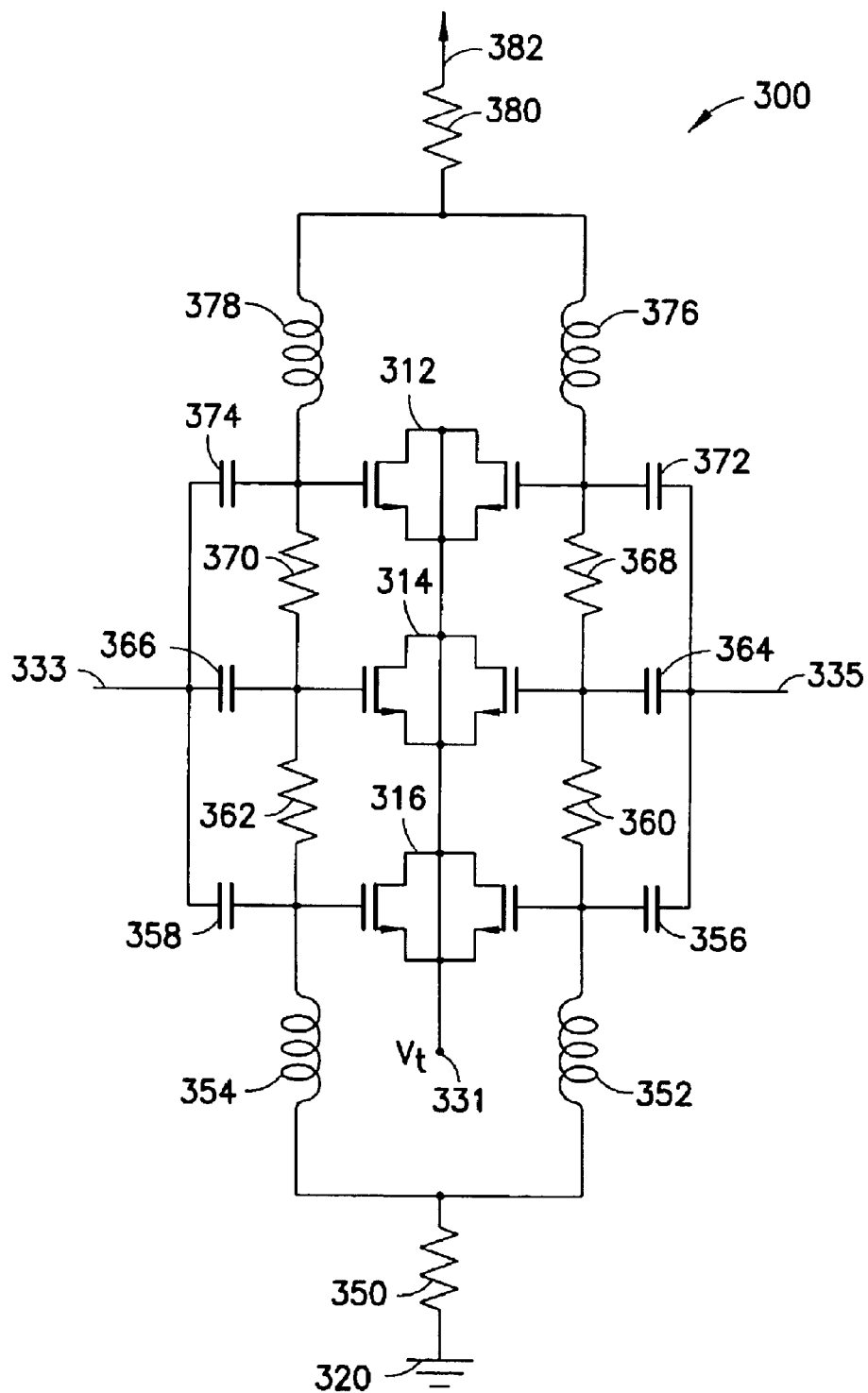
FIG. 5 shows an embodiment of a linearized MOS varactor that uses inductors to separate a direct current from a radio frequency current.

FIG. 5 shows another embodiment of the present invention. FIG. 5 is similar to FIG. 4 except that varactor circuit 300 includes inductors 352, 354, 376 and 378, which separate the direct current (DC) from the radio frequency (RF) current. This configuration reduces leakage of AC current to the power source and thus beneficially decreases the phase noise. Circuit 300 may be used in place of circuit 200 in FIG. 3. The MOS capacitive elements 312, 314 and 316 are each activated as a function of the control voltage Vt 331. The capacitance of each MOS capacitive clement 312, 314 and 316 is combined to produce a composite capacitance. Ground 320 and resistor elements 350, 360, 362, 368, 370, and 380 are shown. Capacitors 356, 358, 364, 366, 372 and 374 are also shown. Nodes 333 and 335 are connected to nodes 233 and 235 in FIG. 3. As control voltage Vt increases, different ones on the capacitive elements 312, 314 and 316 are activated via the biasing network of resistors resulting in the linearization of the combined output.

Also, bias input 382 is shown. Bias input 382 is coupled to a bias voltage source and may be used as a second programmable voltage to control the circuit. Alternatively, Vbias may be held at Vcc and not varied.

Figure 6:
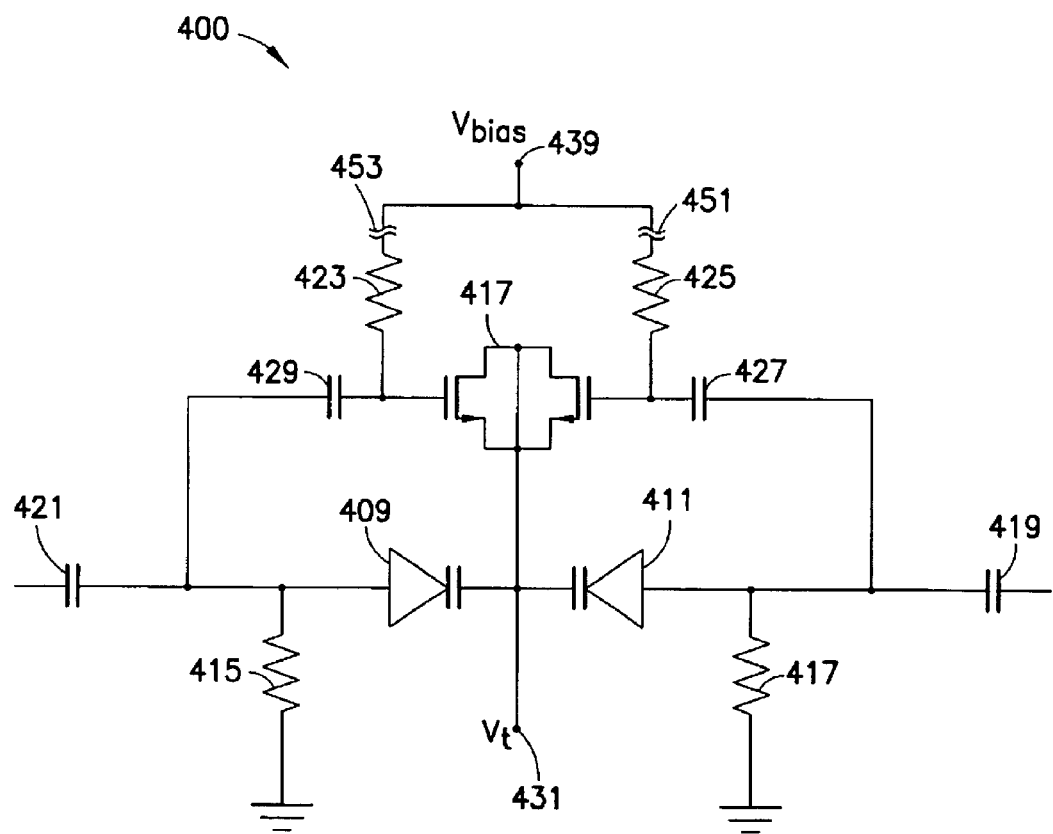
FIG. 6 shows a PN-junction varactor with a linearizing MOS varactor.

FIG. 6 shows an embodiment of the present invention that includes a PN-junction varactor with a linearizing MOS varactor 417. The circuit 400 includes a connection to bias voltage source 439, resistors 423 and 425 and capacitors 427 and 429. Circuit 400 can be substituted for capacitive circuit 200 shown in FIG. 3. MOS varactor 417 linearizes the frequency tuning curve of the diode capacitance. Capacitors 419 and 421 and resistors 415 and 417 are also shown. Varactor diodes 409 and 411 form a varactor tuner. Vt 431 is a control voltage that provides a voltage from a phase locked loop (PLL) circuit. (PLL not shown in FIG. 6.) The MOS varactor 417 can be connected at any place in the resonator. In FIG. 6 the MOS varactor 417 is preferably biased so that it affects the capacitance tuning curve of the varactor diodes 409 and 411 only in the region where the derivative of the dominating varactor capacitance is not constant. The embodiment shown in FIG. 6 illustrates that a MOS varactor can be used in conjunction with a diode varactor for linearizing the voltage tuning curve of the diode varactor. The junction capacitance varies as a function of the junction voltage. FIG. 6 shows MOS varactor 417 as a single MOS transistor. However, sections 451 and 453 illustrate that MOS varactor 417 may also be coupled to a plurality of capacitive elements such as a plurality of MOS transistors, for example the structure shown in FIG. 4.

Figure 7:
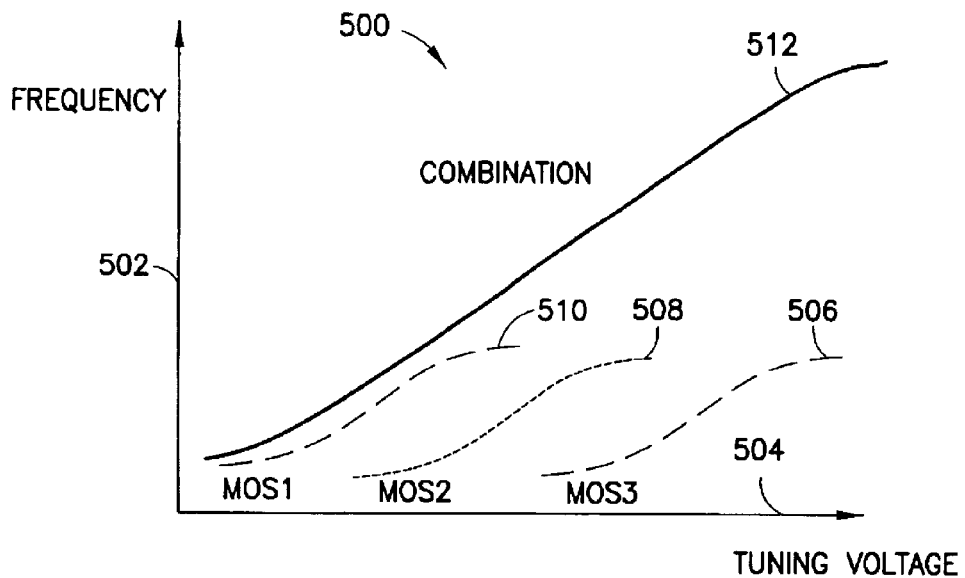
FIG. 7 shows a graph of frequency tuning of a MOS varactor circuit constructed from several MOS varactors.

FIG. 7 shows frequency tuning of a VCO constructed from several MOS varactors. Although only data from three varactors is shown in FIG. 7, any suitable number of varactors could be plotted based on the design requirements of the particular application. The graph 500 shows that the frequency is plotted along the Y-axis 502 and the tuning voltage magnitude is plotted along the X-axis 504. Data related to a first MOS varactor is plotted as line 510, data related to a second MOS varactor is plotted as line 508 and data related to a third MOS varactor is plotted as line 506. Line 512 shows data from the combination of the first, second and third MOS varactors. As shown in FIG. 7, the linearity of the composite curve 512 is substantially improved compared to the linearity of the individual MOS varactors 506, 508 and 510. As control tuning voltage increases, various MOS elements are activated.

Figure 8:
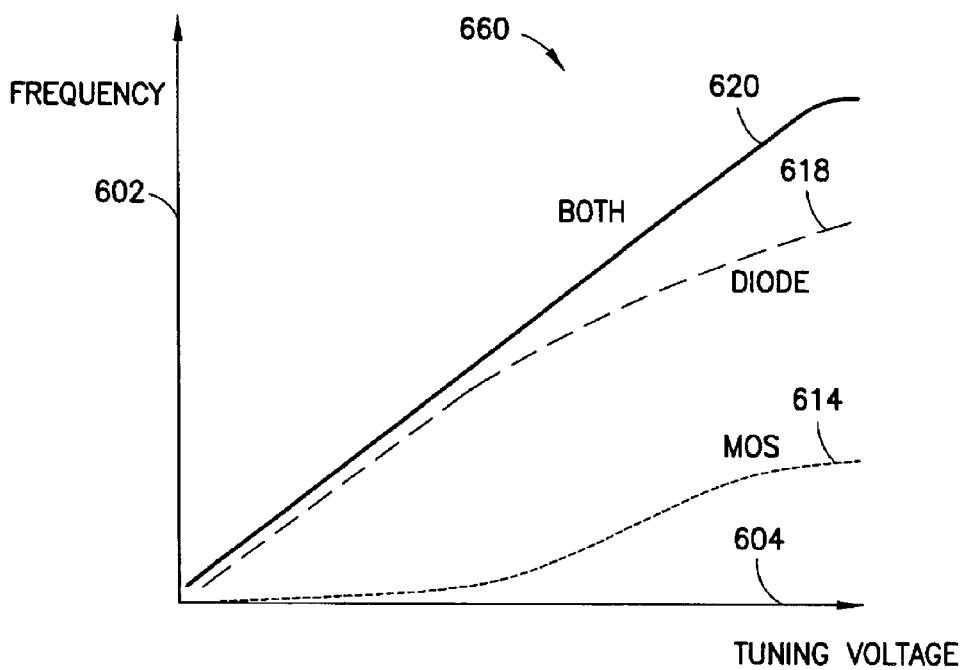
FIG. 8 shows a graph of frequency tuning of a diode varactor linearized with a MOS varactor.

FIG. 8 shows a tuning curve of an oscillator wherein frequency tuning for a diode varactor is linearized with a MOS varactor. Similar to FIG. 7, described above, the graph 600 shows the frequency plotted along the Y-axis 602 and the tuning voltage magnitude is plotted along the X-axis 604. Data related to a MOS varactor is plotted as line 614, and data related to a diode varactor is plotted as line 618. Line 620 shows the combination of the MOS varactor and diode varactor. As shown in FIG. 8, the linearity of the composite curve is substantially improved compared to the linearity of the diode varactor alone. Thus, a MOS varactor can be used to linearize the frequency tuning curve of a diode capacitance.

Thus, this invention linearizes the tuning characteristics of both MOS and PN-junction based varactors, enabling larger tuning range with good phase noise.

The present invention is not restricted to use only with a resonator used with an oscillator, but has applications with all possible resonators.

While the present invention shows the capacitive elements coupled in parallel, it is also within the scope of the invention to couple the capacitive elements in other arrangements, such as for example, a series configuration.

Figure 9:
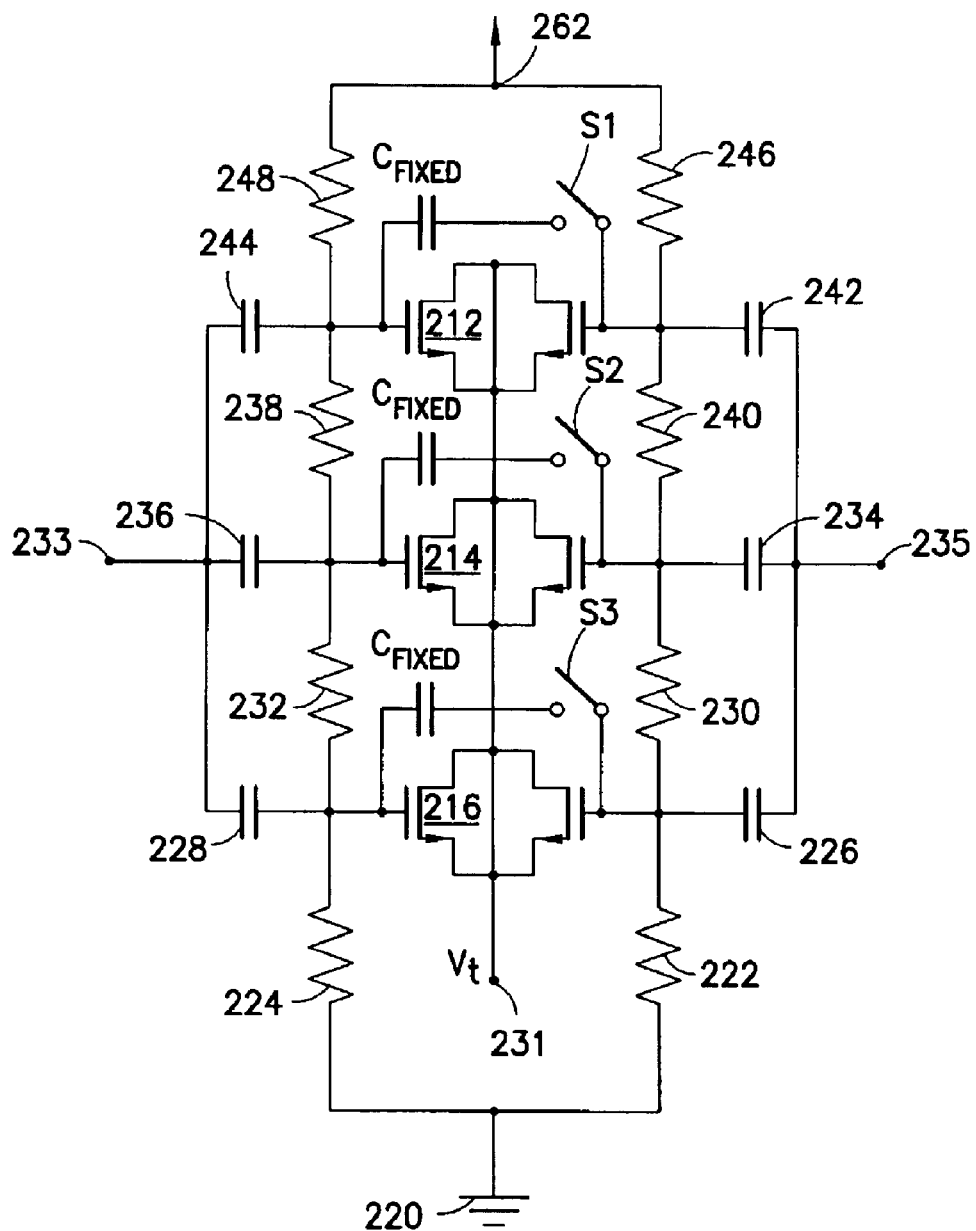
FIG. 9 is a schematic diagram showing a further embodiment wherein fixed capacitors are switchably coupled in parallel with the controllable capacitors.

Furthermore, both fixed and variable capacitors can be used together. For example, and referring to FIG. 9, there is shown a further embodiment of this invention where fixed capacitors ($C_{FIXED}$) are switchably coupled in parallel with the controllable capacitors 212, 214, 216 using digitally controlled (e.g., MOSFET) switches S1, S2, S3. This embodiment enables rather large jumps in frequency to be made by one of opening or closing the switches, thereby either removing or placing one or more of the fixed capacitors in parallel with the variable controlled capacitances 212, 214, 216. In this manner a coarse tuning operation can be performed by the processor 116 of FIG. 1 by selecting one or more of the fixed capacitors. The actual control over the switches S1, S2 S3 may be the responsibility of the frequency band selection logic of the mobile station 100, and may thus provide discrete frequency tuning ranges.

Thus, the specific circuitry that is illustrated and described herein is not intended to be viewed as a limitation upon the practice of this invention, as those skilled in the art will recognize that other circuit embodiments having more or fewer components could be employed to construct an oscillator and VCO. Thus, it should be appreciated that while these teachings have been presented in the context of certain presently preferred embodiments, that changes in form and detail may be made by those skilled in the art, when guided by these teachings, and that these changes will still fall within the scope of the teachings of this invention.

What is claimed is:

1. A voltage-controlled oscillator comprising:
   a resonator circuit that includes a capacitive circuit, the capacitive circuit including a plurality of analog voltage controlled capacitive elements coupled to one another; and
   a bias voltage source coupled to the plurality of analog voltage controlled capacitive elements, the bias voltage source adapted to provide, in combination with a resistive network, a distinct bias voltage to each of the analog voltage controlled capacitive elements;
   where individual ones of the plurality of analog voltage controlled capacitive elements are activated as a function of the magnitude of the voltage thereby increasing linearity of a frequency tuning voltage parameter of the resonator.

2. The voltage-controlled oscillator of claim 1, where the analog voltage controlled capacitive elements comprise a diode varactor and at least one MOS transistor.

3. The oscillator apparatus of claim 1, where the analog voltage controlled capacitive elements include a plurality of MOS transistors.

4. The voltage-controlled oscillator of claim 1, where the analog voltage controlled capacitive elements function as a PN varactor.

5. The oscillator apparatus of claim 1, where the analog voltage controlled capacitive elements function as a MOS varactor.

6. The oscillator apparatus of claim 1, where the analog voltage controlled capacitive elements are activated in a predetermined sequence.

7. The oscillator apparatus of claim 1, where the capacitance of the capacitive circuit is a function of the capacitance of each of the analog voltage controlled capacitive elements.

8. The oscillator apparatus of claim 1, where the plurality of analog voltage controlled capacitive elements are coupled to one another in parallel.

9. The oscillator apparatus of claim 1, further comprising at least one inductor coupled to block direct current components of an electric current.

10. The variable capacitor of claim 1, further comprising at least one inductor coupled to block direct current components of an electric current.

11. A variable capacitor comprising:
    a pair of nodes comprising an input node and an output node for coupling to a resonator;
    a plurality of analog voltage controlled capacitive elements that are electronically coupled to one another and to said pair of nodes; and
    a bias voltage input, coupled to a bias voltage source and coupled in common to each of the plurality of analog voltage controlled capacitive elements via a biasing network, the bias voltage input adapted to provide, in combination with said biasing network, a different bias voltage to each of the analog voltage controlled capacitive elements;
    where individual ones of the plurality of analog voltage controlled capacitive elements are activated as a function of the control voltage, in concert with the biasing network, to provide a substantially linear change in resonator resonant frequency over a range of control voltages between the input node and the output node.

12. The variable capacitor of claim 11, where the plurality of analog voltage controlled capacitive elements are coupled to one another in parallel.

13. The variable capacitor of claim 11, where the analog voltage controlled capacitive elements comprise a diode varactor and at least one MOS transistor.

14. The variable capacitor of claim 11, where the analog voltage controlled capacitive elements include at least one MOS transistor.

15. The variable capacitor of claim 11, where the analog voltage controlled capacitive elements function as a PN varactor.

16. The variable capacitor of claim 11, where the analog voltage controlled capacitive elements function as a MOS varactor.

17. The variable capacitor of claim 11, where the analog voltage controlled capacitive elements are activated in a predetermined sequence.

18. The variable capacitor of claim 16, where the capacitance of the varactor is a function of the capacitance of each of the analog voltage controlled capacitive elements.

19. A method of operating a voltage controlled oscillator, comprising:

generating a plurality of bias voltages;

providing a capacitive circuit that includes a plurality of analog voltage controlled capacitive elements coupled to one another in parallel; and sequentially activating individual ones of the plurality of analog voltage controlled capacitive elements with a unique one of the plurality of bias voltages to increase the linearity of a frequency tuning voltage parameter.

20. The method of claim 19, further comprising blocking a direct current component of an electric current.

21. A mobile station comprising a frequency synthesizer comprised of a phase lock loop (PLL) that includes a voltage controlled oscillator (VCO), a frequency output of said VCO being tuned with a resonator that comprises a variable capacitance, said variable capacitance comprising a plurality of voltage controlled capacitive elements coupled in parallel, further comprising activating means for sequentially activating individual ones of the plurality of voltage controlled capacitive elements as a function of an input analog control voltage and a bias network for increasing linearity of a frequency tuning curve of said VCO; where said bias network comprises a resistive network coupled to said voltage controlled capacitive elements, said resistive network being coupled to a fixed bias voltage.

22. A mobile station as in claim 21, where said analog control voltage is sourced by a PLL phase detector.

23. A mobile station comprising a frequency synthesizer comprised of a phase lock loop (PLL) that includes a voltage controlled oscillator (VCO), a frequency output of said VCO being tuned with a resonator that comprises a variable capacitance, said variable capacitance comprising a plurality of voltage controlled capacitive elements coupled in parallel, further comprising activating means for sequentially activating individual ones of the plurality of voltage controlled capacitive elements as a function of an input analog control voltage and a bias network for increasing linearity of a frequency tuning curve of said VCO; where said bias network comprises a resistive network coupled to said voltage controlled capacitive elements, said resistive network being coupled to a variable bias voltage.

24. A mobile station comprising a frequency synthesizer comprised of a phase lock loop (PLL) that includes a voltage controlled oscillator (VCO), a frequency output of said VCO being tuned with a resonator that comprises a variable capacitance, said variable capacitance comprising a plurality of voltage controlled capacitive elements coupled in parallel, further comprising activating means for sequentially activating individual ones of the plurality of voltage controlled capacitive elements as a function of an input analog control voltage and a bias network for increasing linearity of a frequency tuning curve of said VCO; where said bias network comprises a resistive network coupled to said voltage controlled capacitive elements, said resistive network being coupled to a bias voltage established by one of an operational mode or a frequency selection logic of said mobile station.

* * * * *